US009274146B2

(12) United States Patent
Boudreau, Jr. et al.

(10) Patent No.: US 9,274,146 B2
(45) Date of Patent: Mar. 1, 2016

(54) ELECTRONIC TAMPER DETECTION IN A UTILITY METER USING MAGNETICS

(71) Applicant: Landis+Gyr, Inc., Lafayette, IN (US)

(72) Inventors: Frank J. Boudreau, Jr., Otterbein, IN (US); Matt Kraus, Jamestown, IN (US)

(73) Assignee: Landis+Gyr, Inc., Lafayette, IN (US)

( * ) Notice: Subject to any disclaimer, the term of this patent is extended or adjusted under 35 U.S.C. 154(b) by 73 days.

(21) Appl. No.: 14/176,561

(22) Filed: Feb. 10, 2014

(65) Prior Publication Data

US 2015/0226769 A1 Aug. 13, 2015

(51) Int. Cl.
*G01B 7/14* (2006.01)
*G01R 11/24* (2006.01)
*G01D 5/20* (2006.01)
*G01R 33/07* (2006.01)
*G01R 22/06* (2006.01)
*G01D 4/00* (2006.01)

(52) U.S. Cl.
CPC .............. *G01R 11/24* (2013.01); *G01D 5/2033* (2013.01); *G01R 22/066* (2013.01); *G01R 33/07* (2013.01); *G01D 4/002* (2013.01); *G01D 5/2013* (2013.01)

(58) Field of Classification Search
CPC .... G01D 4/002; G01D 5/2033; G01D 5/2013
USPC ................................. 324/207.13, 207.15, 156
See application file for complete search history.

(56) References Cited

U.S. PATENT DOCUMENTS

| 6,414,475 B1* | 7/2002 | Dames et al. ................. 324/127 |
| 2005/0194962 A1* | 9/2005 | Briese et al. ................. 324/142 |
| 2012/0074927 A1 | 3/2012 | Ramirez |

FOREIGN PATENT DOCUMENTS

EP 0447615 A1 9/1991

OTHER PUBLICATIONS

Notification of Transmittal of the International Search Report and the Written Opinion of the International Searching Authority for PCT/US2015/015286, mailed Jun. 19, 2015.

* cited by examiner

*Primary Examiner* — Reena Aurora
(74) *Attorney, Agent, or Firm* — Maginot, Moore & Beck LLP

(57) ABSTRACT

An arrangement for use in a utility meter includes a sensor and a processing circuit supported by a base of the meter, and a magnetic element carried by the cover of the meter, in which the cover is removably mounted to the base. The sensor includes at least two magnetizable elements, such as inductors, that are magnetized at opposite polarities when the meter is closed and operable. The magnetizable elements are positioned in very close proximity so that as cover is removed the magnetic element passes the elements to cause the magnetizable elements to assume the same polarity. The processing circuit continuously polls the magnetizable elements to evaluate their respective polarities and is configured to issue a tamper indication when the detected polarities are the same.

12 Claims, 6 Drawing Sheets

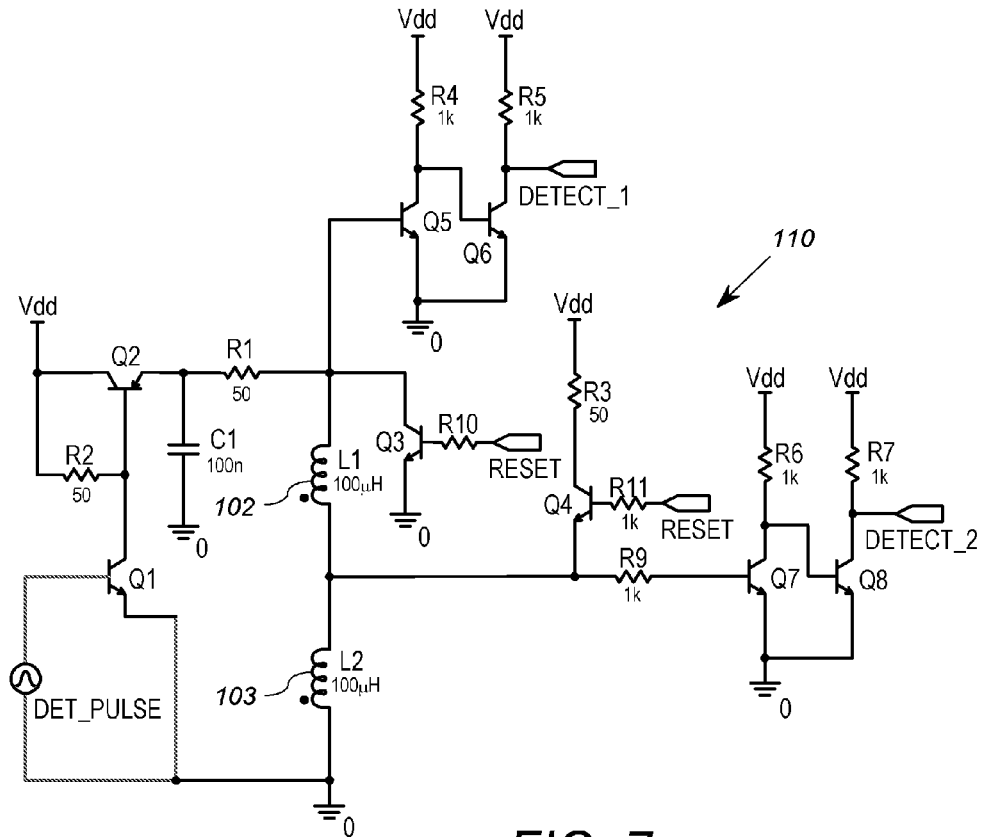
*FIG. 7*
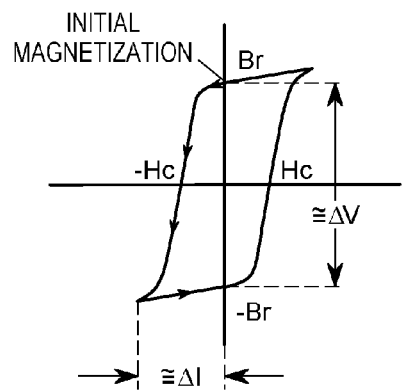
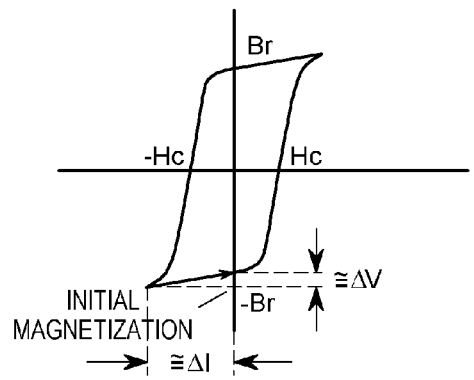
*FIG. 8a*  *FIG. 8b*

ELECTRONIC TAMPER DETECTION IN A UTILITY METER USING MAGNETICS

FIELD OF THE INVENTION

This disclosure relates generally to tamper detection in utility meters.

BACKGROUND

There is a need for devices that detect tampering with utility meters. Tampering with utility meters can cause damage to equipment, serious injury, and loss of revenue. Meter tampering typically involves opening the sealed meter cover to either disable the counting/registration device or to divert a resource (such as water or electricity). By diverting the resource past the meter (i.e. bypassing the meter), the resource may be consumed without recordation or registration for billing purposes.

While meters are crafted in a way such that opening the meter cover is difficult, it is not practical or likely possible to create a meter cover that cannot be removed. Indeed, at least one consideration is that meter technician may be required to open the meter cover at some point. Therefore the meter closure cannot be impenetrable. Accordingly, a main strategy in tamper protection is to detect and flag a tamper event. Because meters are periodically read, either in person or remotely, the flagging of a meter tamper event allows for relatively timely indication that tampering has occurred. Upon receiving evidence of a tamper event, the situation can be corrected.

Traditionally, mechanical seals have been placed between the meter base assembly and its cover to inhibit unauthorized access. In such cases, a broken seal can indicate a tamper event. This protection mechanism, although sufficient on meters employing primary mechanical counters, may not provide adequate protection for electronic meters. In particular, electronic meters can often be read remotely or at least without close inspection of the meter. Accordingly, if an electronic meter has the ability to report metering data remotely, there may seldom be an opportunity for a meter technician to observe a broken seal at the location of the meter.

One approach to tamper detection is to place a position sensor on the meter cover. In particular, as is known in the art, electronic meters typically include processing circuitry. Such processing circuitry can record any movement of position of the sensor. However, this solution is only effective when the meter is powered, since the position sensor circuits otherwise lack bias power. Conceivably, a thief could tamper with the meter during a power outage without detection. If the thief replaced the meter cover before power is restored, the position sensor would never detect an issue.

There is a need, therefore, for improved electronic tamper detection that operates in the absence of meter power, and does not require, or at least rely exclusively on, a mechanical seal.

SUMMARY OF THE INVENTION

At least some embodiments of the present invention address the above described need, as well as others, by providing an arrangement for use in a utility meter, comprising at least two magnetizable elements supported on a first meter structure, such as a meter base, and each configured to be magnetized to a first polarity and an opposite second polarity. A processing circuit is operably coupled to the magnetizable elements to determine the relative polarity of the magnetizable elements and to generate a tamper indication if the magnetizable elements have the same polarity. The arrangement further comprises a magnetic element supported on a second meter structure configured to be physically connected to the first meter structure, such as a meter cover, the magnetic element positioned such that removal of the second meter structure from the first meter structure causes the magnetic element to move past the magnetizable elements. The magnetic element is configured to cause the magnetizable elements to have the same polarity upon passage of the magnetic element.

In a further feature of the disclosed arrangement, the processing circuit is configured to magnetize the magnetizable elements in different polarities when the meter is closed and operational. The magnetizable elements may include inductors with a saturable core with the inductor windings electrically connected to the processing circuit. In certain embodiments the processing circuit may include a voltage divider circuit to which the inductor coils are connected. The voltage divider circuit may include logic elements capable of generating a logical output for each of the magnetizable elements indicative of the polarity of the element. In one aspect, the processing circuit includes a pulse generator for applying a pulse signal with a predetermined polarity to the voltage divider circuit, with the contribution of each inductor to the divided voltage being a function of the polarity of the inductor compared to the predetermined polarity of the pulse signal The above described features and advantages, as well as others, will become more readily apparent to those of ordinary skill in the art by reference to the following detailed description and accompanying drawings.

BRIEF DESCRIPTION OF THE DRAWINGS

FIG. 7 shows a circuit diagram for voltage divider circuitry as part of the magnetic tamper detection feature shown in FIG. 5.

FIGS. 8a, 8b show hysteresis loop diagrams for the inductors used in the magnetic tamper detection feature shown in FIG. 5.

DETAILED DESCRIPTION

Figure 1:
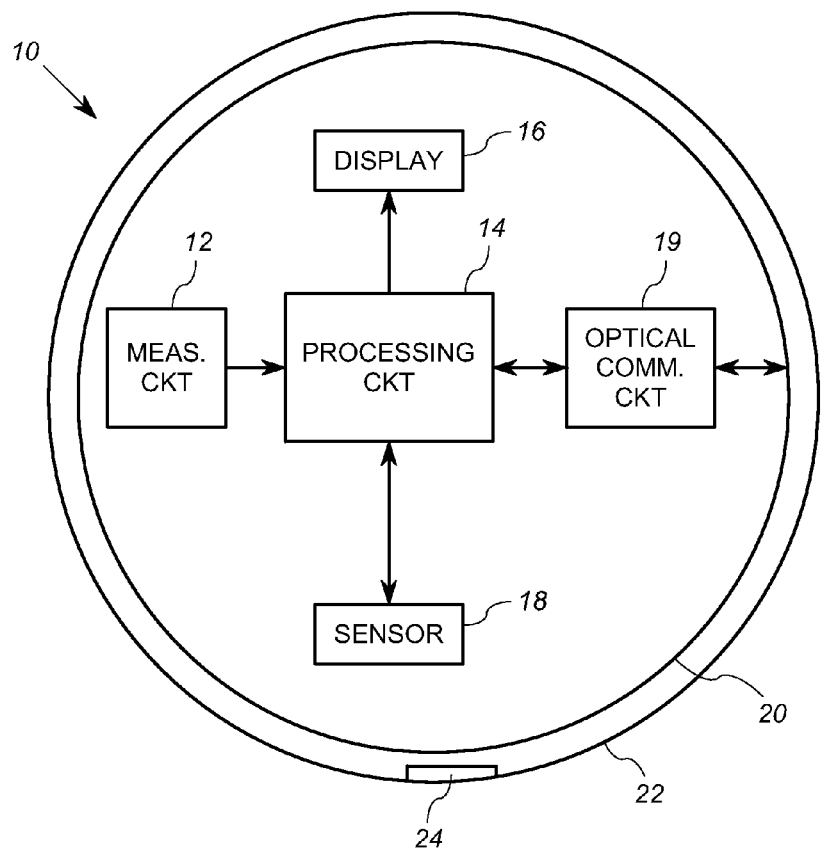
FIG. 1 shows a schematic block diagram of an exemplary electricity meter that incorporates an arrangement for detection according to the present disclosure.

FIG. 1 shows an exemplary electricity meter 10 that incorporates an arrangement for tamper detection according to the invention. The electricity meter 10 includes measurement circuitry 12, a processing circuit 14, a display 16, a sensor 18 and optical communication circuitry 19, all disposed on or supported by or within a structure 20. The meter 10 also includes a cover 22 having an embedded magnet 24.

The measurement circuit 12 includes voltage and/or current sensors, analog to digital conversion circuitry, and other circuitry configured to generate digital measurement and/or energy signals from power lines, not shown. Such circuits for electronic meters are well known in the art. The processing circuit 14 is a circuit that performs control functions with the meter 10 and in many cases performs further processing on the digital measurement signals generated by the measurement circuit 12. For example, the processing circuit 14 may convert raw digital measurement information into a format that is displayable, or convert energy information to derivative types of energy consumption information, such as those related to time-of-use metering and/or demand metering which are known in the art.

In another embodiment, the meter 10 includes a remote communication circuit, as is known in the art, and the processing circuit 14 would communicate metering data to a remote location via such a communication circuit. It will be appreciated that the exact physical configuration of the measurement circuit 12 and the processing circuit 14 is not central to the implementation of the invention, and this embodiment of the invention may be used in a wide variety of meters that include digital processing circuitry. While the processing circuit 14 includes the specific additional functionality related to tamper detection described herein, it may otherwise include known processing circuit structures and functionalities. Suitable embodiments of the measurement circuit 12 and such a processing circuit are described, for example, in U.S. patent application Ser. No. 12/777,244 filed May 10, 2010, Ser. No. 12/537,885, filed Aug. 7, 2009, and Ser. No. 12/652,007, filed Jan. 4, 2010, all of which are incorporated herein by reference.

The display 16 in this embodiment is an LCD display 16 that provides visible display of information as controlled by the processing circuit 14. Such display devices are known in the art and may take many forms.

In a prior tamper detection system, the sensor 18 is a bi-stable magnetic switch, as disclosed in commonly-owned application Ser. No. 13/225,154 [hereinafter "the '154 application"], entitled "Electronic Tamper Detection in a Utility Meter Using Magnetics," filed on Sep. 2, 2011 and published on Mar. 29, 2012, as Pub. No. 2012-0074927 A1, the entire disclosure of which is incorporated herein by reference. As disclosed in the '154 application the bi-stable magnetic switch is configured to controllably make or break an electrical connection based on sensing a particular change in magnetic field. Once in a particular position, the state of the switch does not change until the appropriate magnetic field is detected. As disclosed in the '154 application, the processing circuit 14 is operably connected to determine whether the bi-stable switch sensor 18 is in an open position or closed position. Thus, the processing circuit 14 can determine whether the sensor 18 has detected a particular change in magnetic field.

The structure 20 is a support structure for the meter 10 apart from the cover 22. The structure 20 may include on or more printed circuit boards, and includes the base portion of the meter 10 in this embodiment. (See FIG. 2). In general, when the meter cover 22 is removed from the meter, the structure 20 would be the physical support from which the meter cover 22 is removed.

Accordingly, the meter cover 22 is a physical structure that forms a protective cover over the electronic elements 12, 14, 16 and 18 supported by the structure 20. The meter cover 22 is at least partially transparent to allow reading of the display 16. In many cases, the cover 22 and the structure 20 include mating elements to facilitate securing the cover 22 onto the structure 20. Such mating elements typically require at least some rotation of the meter cover 22 after it has been placed on a corresponding portion of the structure 20. Meter covers that secure to a meter base via a rotational locking procedure are well known in the art.

In general, the meter cover 22 has a final, installed (or fully closed) position and a plurality of non-final positions on the structure 20. The final position is associated with an installed and operating meter 10. In such a case, the meter cover 22 is mated with the structure 20. For example, if the meter cover 22 is threaded, then the final position is when the meter cover 22 is fully rotated to its maximum extent (fully closed position) on the structure 20. In such a position, additional sealing elements may or may not be used to inhibit rotating the meter cover 22 in the opposite direction for the purposes of removal. A non-final position, as used herein, means any position of the meter cover 22 on the structure 20 that is not in the final position, such as, by way of non-limiting example, when the cover 22 is at any stage of rotation toward removal. To this end, FIG. 3, described further below, shows the meter 10 with the cover 22 in final position, and FIG. 4 shows the meter 10 with the cover in a non-final position.

The magnetic element 24 is attached to an interior wall of the meter cover 22 and is generally disposed such that any removal of the cover 22 will cause the magnetic element 24 to pass by the sensor 18. The magnetic element 24 is arranged in such a way as to pass through a position in which the magnetic element 24 is aligned at least in part with the sensor 18 to as to cause the sensor 18 to change its state if it is in a first state, but not in a second state. According to the system disclosed in the '154 application, if the sensor 18 has a first state from which only a north polar magnetic field can change its state, and has a second state from which only a south polar magnetic field can change its state, the magnetic element 24 is aligned such that removal of the meter cover 22 only causes one of the north or south polar magnetic fields to align with the sensor 18 sufficiently to switch the state of the sensor 18.

Figure 2:
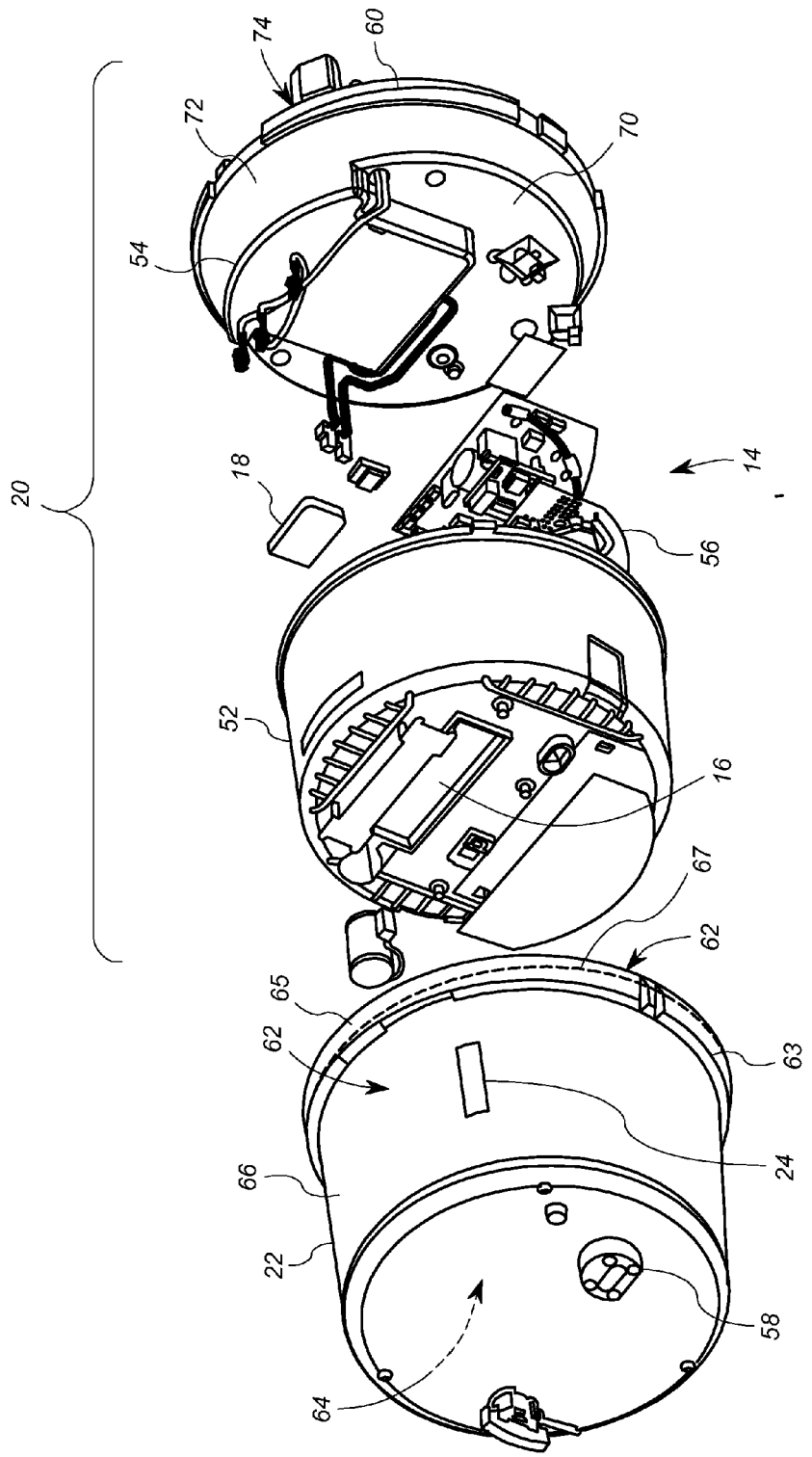
FIG. 2 shows an exploded perspective view of an exemplary embodiment of the meter of FIG. 1.
Figure 3:
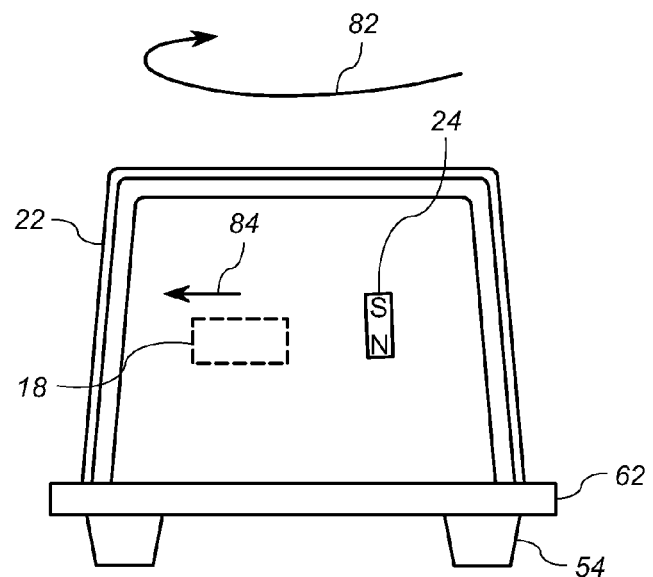
FIG. 3 shows a representative side view of a meter with a magnetic tamper detection feature, shown in a final position.
Figure 4:
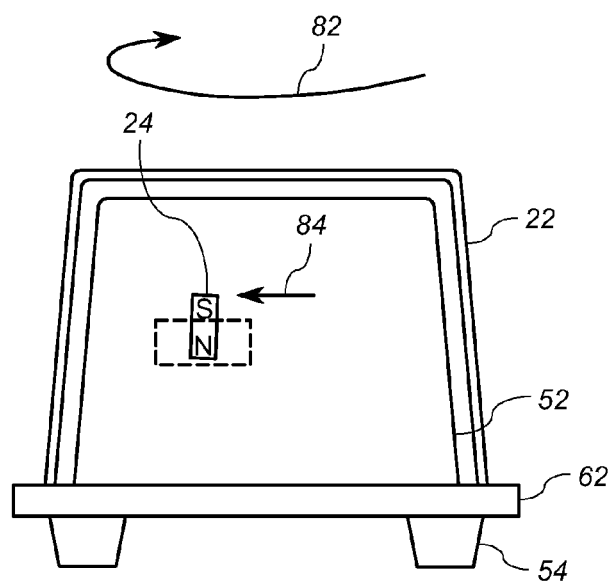
FIG. 4 shows a representative side view of a meter and magnetic tamper detection feature, shown in a non-final position.

FIGS. 2, 3 and 4 show in further detail an exemplary mechanical arrangement of the meter 10 of FIG. 1. FIG. 2 shows an exploded perspective view of a first embodiment of the meter 10, while FIGS. 3 and 4 show side representations of the meter 10 of FIG. 2 in different stages of engagement and removal of the cover 22.

As shown in FIG. 2, the meter cover 22 is a largely cylindrical open bottom structure defining an interior 64 and having a main cylinder wall 66 and a bottom connecting portion 62. It will be appreciated that the cylinder wall 66 may also have a slightly tapered or frustoconical shape. The bottom connecting portion 62 includes an annular shelf 63 extending outward from an open end (i.e. bottom) of the main cylinder wall 66, and an annular skirt 65 continuing downward from an outer edge of the shelf 63. The annular skirt 65 includes a threaded interior surface 67. The threaded interior surface 67 has threading configured to rotatably engage corresponding threads 60 of the structure 20, as will be discussed further below. The meter cover 22 also includes an optical port lens structure 58 configured to provide an optical link from exterior of the meter 10 to the optical communication circuitry 19 which is disposed in the interior of the meter 10. In this embodiment, the meter cover 22 is transparent, and made from a polycarbonate material, which is known the art.

Figure 5:
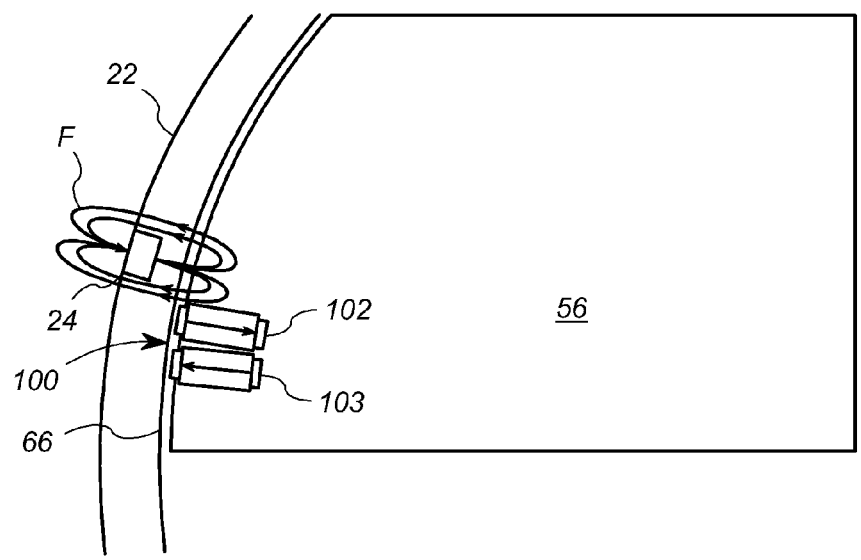
FIG. 5 shows a top partial cut-away view of a meter and meter cover incorporating a magnetic tamper detection feature according to one aspect of the present disclosure, with the meter cover shown in a final position.

The magnetic element 24 is secured to the meter cover 22, such as by an adhesive, in a position such that it exerts a first magnetic field in a radially inward direction with respect to the cylindrical wall 66, as shown in FIG. 5. The magnetic element 24 is disposed in a position such that it passes through the annular position of the sensor 18 when the threads 60, 67 are engaged and the cover 22 is being rotated from the non-final position (or unsecured state) shown in FIG. 4 to the final position (or fully closed state) shown in FIG. 3. The magnetic element 24 is further disposed such that it is not aligned with the annular position of the sensor when the cover 22 is fully rotated into the final position.

The structure 20 includes an interior cover 52, a meter base 54, and a circuit board assembly 56. The interior cover 52 is also a largely cylindrical, open bottom structure defining an interior, not shown in FIG. 2, but which would be readily apparent to one of ordinary skill in the art. The interior cover 52 is sized to fit within the interior 64 of the meter cover 22, and is configured to be attached to the base 54.

The circuit board assembly 56 is disposed within the interior of the interior cover 52. The circuit board assembly 56 includes the processing circuit 14, some or all of the optical communication circuitry 19 and a portion of the measurement circuit 12. Elements of the measurement circuit 12, such as for example, current coils, current transformers, and meter blades, are disposed on the underside of the meter base 54, not shown. The interior cover 52 also supports the display 16. The sensor 18 is mounted within the interior of the meter sufficiently close to the interior of cover 22 so as to allow the magnetic element 24 to actuate the sensor 18 when the magnetic element 24 is passed by the sensor 18.

The meter base 54 includes a main plate 70, an annular side wall 72, and a lower annular skirt 74 having threads 60. The annular side wall 72 extends downward from the main plate 70, and the lower annular skirt 74 extends downward from the side wall 72, although the skirt 74 may include a portion that extends partly radially outward from the side wall 72 as well, as shown in FIG. 2. The annular skirt 74 and threads 60 are arranged such that the threaded portion 67 of the skirt 66 of the meter cover 22 engage threads 60. This engagement is such that, when the meter cover 22 is rotated in the proper direction, the threads 60 and 67 cooperate to secure the meter cover 22 to the meter base 54, and hence the structure 20. It will be appreciated that additional elements may be used to prevent or inhibit movement (i.e. secure the meter cover 22) once the meter cover 22 is in the final position.

The circuit board assembly 56 is secured to the main plate 70. As discussed above, current sensors and other devices, not shown, but which are known in the art, are mounted to the underside of the main plate 70.

FIGS. 3 and 4 show side views of the exemplary meter 10 of FIG. 2 fully assembled. FIG. 3 shows the meter 10 in the fully installed position, that is, in which the meter cover 22 is in its final position for ordinary ongoing meter operations. As shown in FIG. 3, the magnetic element 24 in this case has first end 24a with a first polarity N and a second end 24b with a second polarity S, according to the system disclosed in the '154 application. Also show in phantom is the sensor 18 according to the tamper detection system disclosed in the '154 application, which is located inside the interior cover 52 and which would not normally be visible in a plan view.

In the fully closed position of FIG. 3, the magnetic element 24 is axially aligned with (i.e. vertically on the same level as) the sensor 18, but is not aligned with the annular or radial position with the sensor 18. In this position, the magnetic field of the magnetic element will not activate the sensor 18. It will further be appreciated that to remove the meter cover 22 from the base 54, the meter cover 22 must be rotated in the clockwise direction 82. When rotating in such direction, the magnetic element 24 moves in the direction 84 towards (and ultimately past) the sensor 18.

FIG. 4 shows the meter 10 wherein the meter cover 22 has been partially rotated in the clockwise direction 82 as if to remove the meter cover 22. As a result of this rotation, the magnetic element 24 moves such that it is at least temporarily aligned radially with the sensor 18. As the magnetic element 24 passes to and through this position, the magnetic field causes the sensor 18 to change its state. Thus, in operation of the tamper detection feature, when the meter cover 22 is inserted on to the structure 20 (rotated onto the base 54 via the threads 60, 67), the magnetic field of the magnetic element 24 passes the sensor 18, thus causing it so change state.

In the tamper detection feature disclosed in the '154 application, once the meter cover 22 is installed, an external magnetic element is passed over the bi-stable magnetic relay sensor 18 such that it changes the bi-stable state of the relay 18 to a state that will only change upon detection of a particular magnetic field polarity of the magnetic element 24. This may be done as one of the final manufacturing or commissioning steps for the meter 10, or any time after authorized service of the meter. In such condition, the meter 10 may then be installed in the field.

During normal operation, the processing circuit 10 detects the status of the sensor 18. The sensor does not change state until it has been exposed to a significant magnetic field. In the system disclosed in the '154 patent, the magnetic field must also have a specific polarity to trigger the sensor because the sensor 18 also has a specific polarity.

If the meter 10 is tampered with, specifically, by removing the cover 22, then the magnetic element 24 will pass over the sensor 18, as shown in FIG. 4, exposing the sensor to a magnetic field of the specific polarity. The only practical way to non-destructively tamper with the interior operations of the meter 10 is to remove the cover 22 by rotating the cover 22 in the open direction 82. As shown in FIGS. 3 and 4, moving the cover 22 in the direction 82 causes the magnetic element 24 to pass to its closest point to the sensor 18 which will necessarily cause the sensor 18 to change its state. The processing circuit 14 detects this change and records a tamper event.

In response to detecting a tamper event, the processing circuit 14 may suitably cause a display of a tamper indicator or code on the meter display 16. In embodiments in which the processing circuit 14 is capable of remote communications, the processing circuit 14 can cause transmission of information indicating a tamper event to a remote device.

As thus far described, the tamper detection feature depicted in FIGS. 3 and 4 corresponds to the system disclosed in the '154 application. Since the sensor 18 in the system of the '154 application is a bi-stable switch, specific polarities are necessary for the sensor and magnetic element. Moreover, as described above, the specific polarity of the sensor 18 must be established by an external magnet after the cover has been installed. Moreover, the bi-stable or Reed-type switch of the system disclosed in the '154 application can still be susceptible to tampering, albeit on a more sophisticated level than prior tamper detection systems.

Figure 6:
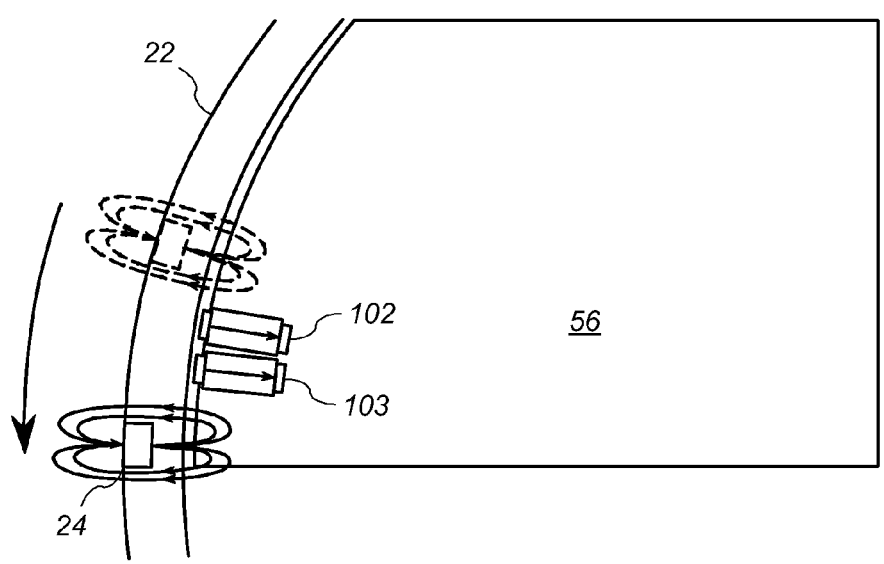
FIG. 6 shows a top partial cut-away view of the meter and meter cover shown in FIG. 5, with the meter cover shown in a non-final position.

In order to address these aspects of the bi-stable switch system disclosed in the '154 application, the present disclosure contemplates side-by-side inductors that can be "encoded". In accordance with one aspect of the present disclosure, a sensor 100 is provided within the cover 22 and in alignment with the magnet 24 mounted to the cover in a manner similar to the sensor 18 discussed above. The sensor 100 includes at least two helically wound inductors 102, 103 that are supported immediately adjacent the cover so that the inductors can be influenced by the magnetic field F surrounding the magnet 24, as illustrated in FIGS. 5 and 6. The inductors 102, 103 are immediately adjacent each other in close proximity so that the magnetic field F must necessarily pass over both inductors. The inductors 102, 103 have a core with a high reluctance and a high magnetic memory. In one specific embodiment the core of the inductors can be a chromium-oxide metal.

In one aspect of the invention, the inductors are magnetized to a specific different polarity. Thus, as illustrated in FIG. 5, the inductor 102 may have a positive polarity while the inductor 103 may have a negative polarity. This polarity is maintained as long as the inductors are not exposed to a magnetic field. When the cover 22 is rotated for removal from the base of the meter, the magnet passes the sensor 100 so that the magnetic field passes over both inductors forcing them to have the same polarity. Thus, in the example shown in FIG. 6, when the magnet 24 passes over the inductors both have a positive polarity. Circuitry within the meter, such as on the circuit board structure 56, detects the common polarity and issues a tamper indication, as described in more detail herein.

Figure 9:
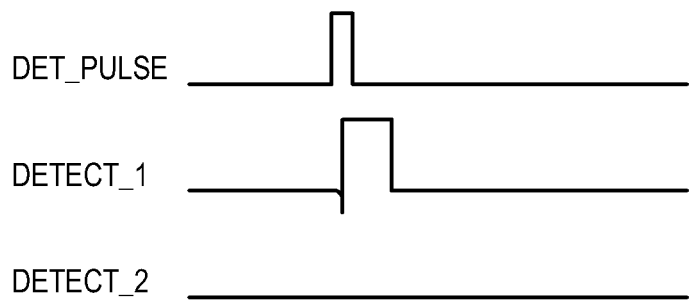
FIG. 9 shows a graph of the detection signals generated by the voltage divider circuitry shown in FIG. 7 in a normal, non-tamper operating condition of the magnetic tamper detection feature shown in FIG. 5.

An exemplary circuit for detecting the polarity of the inductors is shown in FIG. 7. In particular, the coils of the inductors 102, 103 are integrated into a voltage divider circuit 110. A pulse (Det_Pulse) is provided to the circuit such that the impedance of the inductance is much greater than the impedance of resistor R1, with the pulse divided across the inductors 102, 103. An inductor magnetized in a polarity similar to the pulse will show a lower inductance and will not contribute to the divided voltage. On the other hand, an inductor magnetized at an opposite polarity to the pulse will show a maximum inductance and will thus represent a substantial component in the voltage divider circuit 110. The outputs of the coils of the inductors 102, 103 are at nodes S1 and S2, respectively. Signals at these outputs can drive the base of a corresponding transistor Q5 and Q7 to provide logic signals at respective inputs Detect 1 and Detect 2 to a microcontroller. Thus, for an inductor of a different polarity than the pulse signal, such as the inductor 102, the output signal S1 provides a base voltage for the transistor Q5 that is sufficient to drive the transistor, so the output Detect 1 shows a logical "1". Alternatively, for an inductor, such as inductor 103, of the same polarity as the pulse Det_Pulse, the output signal S2 provides a base voltage to the transistor Q7 that is insufficient for saturation of the transistor, so the output Detect 2 shows a logical "0". The microcontroller, which may be integrated into the circuit board structure 56, the measuring circuit 12 or the processing circuit 14, polls the logic signals Detect 1, Detect 2 upon powering up the meter and periodically thereafter. Exemplary signals for a properly encoded meter that has not been tampered with are shown in FIG. 9.

Figure 10A:
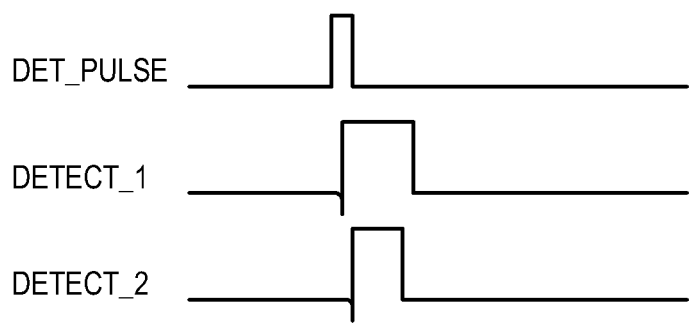
FIG. 10a, 10b show graphs of detection signals generated by the voltage divider circuitry shown in FIG. 7 in two tamper conditions.
Figure 10B:
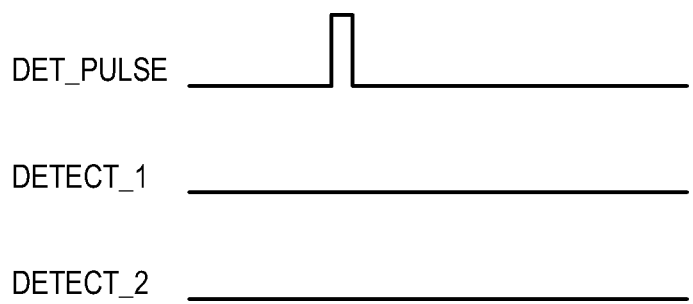

It can be appreciated that when the cover 22 is closed on the meter and the inductors have been encoded with different polarities, as illustrated in FIG. 5, the logic signals at Detect 1 and Detect 2 will be different because only one of the inductors will essentially contributing to the divided voltage, as explained above. As long as the signals remain different no tampering is indicated. However, once the magnet 24 passes the inductors, the both move to the same polarity and the voltage divider circuit 110 will produce signals at S1 and S2 that are substantially equal, resulting in logic signals at Detect 1 and Detect 2 that are the same. When Detect 1 and Detect 2 are the same the microcontroller generates a tamper signal, as described above in connection with the sensor 18. Exemplary signals indicative of tampering are shown in FIGS. 10a and 10b.

The microcontroller is thus configured to analyze the signals Detect 1 and Detect 2 as set forth in the following table:

| Stimulus | S1/Detect1 | S2/Detect 2 | Result |
|---|---|---|---|
| None | High | Low | No tamper detected. Magnetization polarities are unchanged |
| External Magnet Positive Polarity | High | High | Tamper detected. |
| External Magnet Negative Polarity | Low | Low | Tamper detected. |
| Cover removed | Low | Low | Tamper detected |
| Heating of Inductors | High | High | Tamper detected. |

It is noted that the last stimulus relates to tampering in which the inductors are heated to essentially demagnetize the cores. Given the proximity of the inductors to each other it is not likely that one inductor can be heated without heating the other. However, since the inductors are encoded to different polarities, changing the polarity of only one inductor means that both inductors will have the same polarity and tampering will be detected by the microcontroller.

The inductors 102, 103 can be set to a specific polarity by saturating the inductor with a DC signal in the desired direction of polarity. For instance, the inductor 102 can be set by applying a signal at the Reset line to the transistor Q3, while the inductor 103 can be set at a desired polarity by a signal at the Reset line to transistor Q4. The Reset signal is applied for a time sufficient for a voltage at to the coil to saturate the inductor core material. Maximum inductance corresponding to a positive polarity in an inductor is shown in hysteresis loop of FIG. 8a, while the minimum inductance and a negative polarity is shown in hysteresis loop in FIG. 8b. The microcontroller is configured to apply a different polarity DC signal to each of the Reset lines to drive the two inductors 102, 103 to opposite polarity. It can be appreciated that this action cannot be accomplished with the cover 24 removed or disengaged from the meter because once the cover is restored to its closed final position shown in FIG. 5 the magnet 24 must traverse the inductors, which necessarily will force the inductors to the same polarity. Moreover, the inductors cannot be saturated form outside the meter and cover 22 such as by placing a magnet in proximity to the sensor 100. The inductors 102, 103 are in very close proximity so that attempting to saturate one inductor will necessarily cause the magnetic field to intersect the other inductor. The tampering detection system of the present invention provides that the only method of encoding the polarities of the inductors is by an internal microcontroller (via the Reset lines) when the meter is closed.

The sensor 100 disclosed herein provides the advantage of not requiring power to the inductors to maintain them in their encoded polarities. Moreover, the inductors need not be powered in order to respond to a tampering attempt. The magnetic cores of the inductors respond to passage of a magnet or external heating to assume same polarity, whether positive or negative. Once the meter is powered again the microcontroller polls the Detect 1 and Detect 2 lines and the logic signals at these lines will be determined by the voltage divider circuitry 110 as explained above. The tamper indication feature may be disabled by an authorized party, whether remotely for wireless connected meters or via the optical port. The encoding of the inductor polarities may also be activated or accomplished remotely or via the optical port.

In the illustrated embodiment the sensor 100 is formed by two inductors. The inductors may be surrounded by magnetic shielding to prevent interference from an extraneous EMF source and to further limit the ability to somehow focus a magnetic field on individual inductors.

In one modification, the polarity of the inductors may be determined using a Hall-effect sensor positioned at the inner end of each inductor. The polarity of the voltage output of the Hall-effect sensor is indicative of the polarity of the inductor. In this instance, the voltage divider circuitry 110 would not be required.

In another modification, more the sensor 100 may be include more than two inductors with more than two bits of information provided to the microcontroller. More than two inductors can provide tolerance for error, such as if an inductor fails in some manner or somehow changes polarity when no tampering has occurred. For multiple inductors the microprocessor may be calibrated to acknowledge a certain threshold of changed polarities as an indication of tampering. Moreover, providing multiple inductors around the inner circumference of the cover 22 can make it virtually impossible to externally control the polarity of any individual inductor.

The above describe embodiments are merely exemplary. Those of ordinary skill in the art may readily devise their own implementations and modifications that incorporate the principles of the present invention and fall within the spirit and scope thereof. For example, it will be appreciated that a similar technique may be employed in a water or gas meter, if such meter includes digital processing circuitry.

What is claimed is:

1. An arrangement for use in a utility meter, comprising:
   two magnetizable elements supported on a first meter structure and each configured to be magnetized to a first polarity and an opposite second polarity;
   a processing circuit operably coupled to the two magnetizable elements to determine the relative polarity of the two magnetizable elements to generate a tamper indication if the two magnetizable elements have the same polarity; and
   a magnetic element supported on a second meter structure configured to be physically connected to the first meter structure, the magnetic element positioned such that removal of the second meter structure from the first meter structure causes the magnetic element to move past the two magnetizable elements, the magnetic element configured to cause the two magnetizable elements to have the same polarity upon passage of the magnetic element.

2. The arrangement of claim 1, wherein each of the two magnetizable elements is configured to maintain its respective polarity without external power.

3. The arrangement of claim 1, wherein said first meter structure includes a base and said second meter structure includes a meter cover configured to be removably engaged to said base.

4. The arrangement of claim 3, wherein:
   the meter cover and base are provided with a threaded engagement configured for rotatable engagement of the cover to the base to at least partially secure the cover thereto; and
   the magnet element and two magnetizable elements are arranged so that the magnet element moves past the magnetizable elements upon rotation of said cover relative to said base.

5. The arrangement of claim 4, wherein:
   said meter cover has a final position and a plurality of non-final positions on said base; and
   said magnetic element is radially aligned with the two magnetizable elements only when said cover is in one of the plurality of non-final positions.

6. The arrangement of claim 1, wherein the two magnetizable elements are inductors having a magnetizable core.

7. The arrangement of claim 6, wherein the processing circuit includes:
   a voltage divider circuit with each branch of the voltage divider circuit connected to an inductor of a corresponding one of the two magnetizable elements; and
   a pulse generator for applying a pulse input signal having a predetermined polarity to each branch of the voltage divider circuit.

8. The arrangement of claim 7, wherein the voltage divider circuit is configured such that an inductor magnetized to the same polarity as the predetermined polarity of the pulse input signal does not contribute to the divided voltage in the circuit, and an inductor magnetized to a different polarity than the predetermined polarity generates a substantial contribution to the divided voltage.

9. The arrangement of claim 7, wherein the processing circuit includes logic elements configured to convert the divided voltage into logic signals.

10. The arrangement of claim 9, wherein the logic elements include a transistor associated with each branch of the voltage divider circuit, with the base of the transistor driven by a voltage output from a corresponding inductor.

11. The arrangement of claim 1, wherein the processing circuit is configured to selectively magnetize each of the two magnetizable elements.

12. The arrangement of claim 11, wherein:
   the two magnetizable elements are inductors having a magnetizable core; and
   the processing circuit is configured to apply a voltage to the coil of the inductors sufficient to saturate the magnetizable core.

* * * * *